(12) United States Patent
He et al.

(10) Patent No.: US 8,901,649 B2
(45) Date of Patent: Dec. 2, 2014

(54) SEMICONDUCTOR DEVICE, ELECTROSTATIC DISCHARGE PROTECTION DEVICE AND MANUFACTURING METHOD THEREOF

(75) Inventors: Chieh-Wei He, Hsinchu (TW); Shih-Yu Wang, Hsinchu (TW); Qi-An Xu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 27 days.

(21) Appl. No.: 13/238,858

(22) Filed: Sep. 21, 2011

(65) Prior Publication Data

US 2013/0069125 A1  Mar. 21, 2013

(51) Int. Cl.
H01L 29/66 (2006.01)
H01L 29/78 (2006.01)
H01L 29/10 (2006.01)
H01L 29/08 (2006.01)

(52) U.S. Cl.
CPC ............ *H01L 29/78* (2013.01); *H01L 29/1083* (2013.01); *H01L 29/66659* (2013.01); *H01L 29/0847* (2013.01)
USPC 257/336; 257/288; 257/E27.06; 257/E29.256; 438/223; 438/514; 438/519

(58) Field of Classification Search
CPC .................................................. H01L 29/7833
USPC ............... 257/288, 336, E27.06, E29.256; 438/223, 514, 519
See application file for complete search history.

(56) References Cited

U.S. PATENT DOCUMENTS

| | | | | |
|---|---|---|---|---|
| 5,674,761 A | * | 10/1997 | Chang et al. | 438/237 |
| 6,171,891 B1 | * | 1/2001 | Lee et al. | 438/197 |
| 6,265,251 B1 | * | 7/2001 | Jun et al. | 438/183 |
| 2002/0003236 A1 | * | 1/2002 | Czech et al. | 257/173 |
| 2004/0227190 A1 | * | 11/2004 | Cai et al. | 257/365 |

* cited by examiner

Primary Examiner — Kyoung Lee
Assistant Examiner — Ratisha Mehta
(74) Attorney, Agent, or Firm — J.C. Patents

(57) ABSTRACT

A semiconductor device, an electrostatic discharge protection device and manufacturing method thereof are provided. The electrostatic discharge protection device includes a gate, a gate dielectric layer, an N-type source region, an N-type drain region, an N-type doped region and a P-type doped region. The gate dielectric layer is disposed on a substrate. The gate is disposed on the gate dielectric layer. The N-type source region and the N-type drain region are disposed in the substrate at two sides of the gate, respectively. The N-type doped region is disposed in the N-type drain region and connects to the top of the N-type drain region. The P-type doped region is disposed under the N-type drain region and connects to the bottom of the N-type drain region.

14 Claims, 5 Drawing Sheets

SEMICONDUCTOR DEVICE, ELECTROSTATIC DISCHARGE PROTECTION DEVICE AND MANUFACTURING METHOD THEREOF

BACKGROUND OF THE INVENTION

1. Field of the Invention

The invention relates to a semiconductor device and a manufacturing method thereof, and more particularly to an electrostatic discharge (ESD) protection device and a manufacturing method thereof.

2. Description of Related Art

Electrostatic discharge refers to an electrostatic charge movement on a non-conductive surface and may lead to damages of semiconductor devices and other circuits in an integrated circuit. For example, when conventional charged bodies such as integrated circuit packaging machines, integrated circuit testing apparatuses, or the like contact chips, the conventional charged bodies are then discharged to the chips. At this time, the instantaneous power of ESD may cause damage or malfunction of integrated circuits in the chips. In order to prevent the integrated circuit from being damaged by ESD, an ESD protection device is usually adopted in an integrated circuit.

An ESD protection device including a silicide block disposed on a drain of an N-type transistor is a conventional ESD protection device, such that an electrostatic current is prevented from flowing through the surface of a substrate to damage the device. Consequently, the device can be protected from ESD. However, when forming the silicide block layer aforementioned, a mask has to be additionally applied, thereby increasing the complexity of the manufacturing process and the manufacturing cost.

SUMMARY OF THE INVENTION

The invention is directed to an electrostatic discharge (ESD) protection device capable of preventing a device from being damaged by an electrostatic current.

The invention is further directed to a manufacturing method of an ESD protection device which includes less manufacturing steps and has lower manufacturing cost.

The invention is further directed to a semiconductor device capable of preventing a device from being damaged by an electrostatic current.

The invention is directed to an ESD protection device including a gate, a gate dielectric layer, an N-type source region, an N-type drain region, an N-type doped region, and a P-type doped region. The gate dielectric layer is disposed on the substrate. The gate is disposed on the gate dielectric layer. The N-type source region and the N-type drain region are disposed in the substrate at two sides of the gate respectively. The N-type doped region is disposed in the N-type drain region and connects to the top of the N-type drain region. The P-type doped region is disposed under the N-type drain region and connects to the bottom of the N-type drain region.

According to the ESD protection device illustrated in the embodiments of the invention, the P-type doped region connects to the bottom of the N-type drain region partially, for example.

According to the ESD protection device illustrated in the embodiments of the invention, the P-type doped region connects to the bottom of the N-type drain region entirely, for example.

According to the ESD protection device illustrated in the embodiments of the invention, the N-type doped region connects to the top of the N-type drain region partially, for example.

According to the ESD protection device illustrated in the embodiments of the invention, the N-type doped region connects to the top of the N-type drain region entirely, for example.

According to the ESD protection device illustrated in the embodiments of the invention, a doping concentration of the N-type drain region is, for example, higher than a doping concentration of the N-type doped region.

According to the ESD protection device illustrated in the embodiments of the invention, the substrate is a P-type substrate, for instance, and a doping concentration of the P-type doped region is higher than a doping concentration of the substrate.

The invention is further directed to a manufacturing method of an ESD protection device. In this method, a substrate having a memory region and a peripheral circuit region is first provided. A first gate structure is formed in the memory region and a second gate structure is formed in the peripheral circuit region. A P-type pocket doped region is formed in the substrate under the first gate structure, an N-type lightly doped drain (LDD) region is formed in the substrate at two sides of the first gate structure, and an N-type doped region and a P-type doped region are formed in the substrate at one of two sides of the second gate structure. Here, the P-type pocket doped region is adjacent to the N-type lightly doped drain region. The P-type doped region is located under the N-type doped region. The P-type doped region and the N-type doped region are separated from each other. A first N-type source region and a first N-type drain region are formed in the substrate at the two sides of the first gate structure respectively, and a second N-type source region and a second N-type drain region are formed in the substrate at the two sides of the second gate structure respectively. Herein, the N-type doped region is located in the second N-type drain region and connects to the top of the second N-type drain region. The P-type doped region is located under the second N-type drain region and connects to the bottom of the second N-type drain region.

According to the method of manufacturing the ESD protection device illustrated in the embodiments of the invention, the P-type doped region connects to the bottom of the second N-type drain region partially, for example.

According to the method of manufacturing the ESD protection device illustrated in the embodiments of the invention, the P-type doped region connects to the bottom of the second N-type drain region entirely, for example.

According to the method of manufacturing the ESD protection device illustrated in the embodiments of the invention, the N-type doped region connects to the top of the second N-type drain region partially, for example.

According to the method of manufacturing the ESD protection device illustrated in the embodiments of the invention, the N-type doped region connects to the top of the second N-type drain region entirely, for example.

According to the method of manufacturing the ESD protection device illustrated in the embodiments of the invention, a doping concentration of the second N-type drain region is, for example, higher than a doping concentration of the N-type doped region.

According to the method of manufacturing the ESD protection device illustrated in the embodiments of the invention, the substrate is a P-type substrate, for instance, and a doping concentration of the P-type doped region is higher than a doping concentration of the substrate.

The invention is further directed to a semiconductor device including a substrate, a memory and an electrostatic discharge protection device. The substrate has a memory region and a peripheral circuit region. The memory is disposed in the memory region. The electrostatic discharge protection device is disposed in the peripheral circuit region. The electrostatic discharge protection device includes a gate, a gate dielectric layer, an N-type source region, an N-type drain region, an N-type doped region, and a P-type doped region. The gate dielectric layer is disposed on the substrate. The gate is disposed on the gate dielectric layer. The N-type source region and the N-type drain region are disposed in the substrate at two sides of the gate respectively. The N-type doped region is disposed in the N-type drain region and connects to the top of the N-type drain region. The P-type doped region is disposed under the N-type drain region and connects to the bottom of the N-type drain region.

According to the semiconductor device illustrated in the embodiments of the invention, the P-type doped region connects to the bottom of the N-type drain region partially, for example.

According to the semiconductor device illustrated in the embodiments of the invention, the P-type doped region connects to the bottom of the N-type drain region entirely, for example.

According to the semiconductor device illustrated in the embodiments of the invention, the N-type doped region connects to the top of the N-type drain region partially, for example.

According to the semiconductor device illustrated in the embodiments of the invention, the N-type doped region connects to the top of the N-type drain region entirely, for example.

According to the semiconductor device illustrated in the embodiments of the invention, a doping concentration of the N-type drain region is, for example, higher than a doping concentration of the N-type doped region.

According to the semiconductor device illustrated in the embodiments of the invention, the substrate is a P-type substrate, for instance, and a doping concentration of the P-type doped region is higher than a doping concentration of the substrate.

In light of the foregoing, as the P-type doped region is disposed under the N-type drain region in the ESD protection device of the invention, when an electrostatic current is generated and flows to the ESD protection device, the electrostatic current flowing to the N-type drain region then changes its circuit path and flows down to the P-type doped region. As a result, the devices on the surface of the substrate are prevented from being damaged by the electrostatic current. Further, steps for forming the P-type doped region aforementioned are integrated to the manufacturing process of the memory region in the invention. The manufacturing complexity can thus be reduced and the manufacturing cost can be lowered.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1:
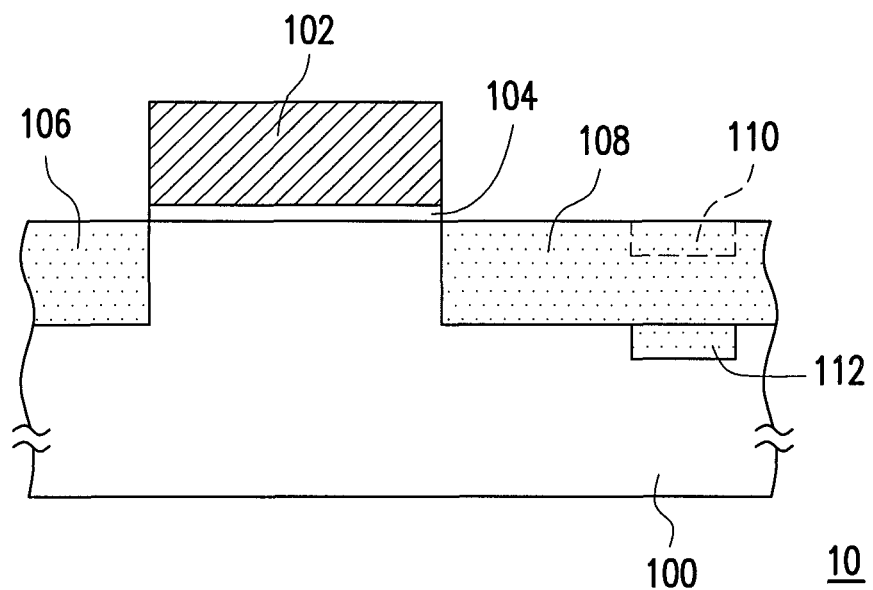
FIG. 1 shows a schematic cross-sectional view of an electrostatic discharge (ESD) protection device according to an embodiment of the invention.

FIG. 1 shows a schematic cross-sectional view of an electrostatic discharge (ESD) protection device according to an embodiment of the invention. Referring to FIG. 1, an ESD protection device 10 includes a gate 102, a gate dielectric layer 104, an N-type source region 106, an N-type drain region 108, an N-type doped region 110, and a P-type doped region 112. The gate 102 is disposed on the substrate 100. The gate 102 is, for example, a polysilicon, silicon germanium, or metal gate. The gate dielectric layer 104 is disposed between the gate 102 and the substrate 100. The gate dielectric layer 104 is, for instance, an oxide layer, nitrided oxide layer, nitride layer, oxynitride, high dielectric constant layer, or the combination thereof. The N-type source region 106 and the N-type drain region 108 are disposed in the substrate 100 at two sides of the gate 102 respectively. A dopant in the N-type source region 106 and the N-type drain region 108 is, for example, phosphorus or arsenic. A doping concentration of the dopant ranges from $3\times10^{15}$ atom/cm$^3$ to $6\times10^{15}$ atom/cm$^3$, for example.

The N-type doped region 110 is disposed in the N-type drain region 108 and connects to the top of the N-type drain region 108 partially. In the present embodiment, the N-type doped region 110 is disposed away from the gate 102. A dopant in the N-type doped region 110 is, for example, phosphorus or arsenic. A doping concentration of the dopant ranges from $1\times10^{15}$ atom/cm$^3$ to $2\times10^{15}$ atom/cm$^3$, for example. The P-type doped region 112 is disposed under the N-type drain region 108 and connects to the bottom of the N-type drain region 108 partially. In the present embodiment, the P-type doped region 112 is disposed away from the gate 102. The P-type doped region 112 and the N-type doped region 110 are disposed corresponding to each other. Obviously, in other embodiments, the P-type doped region 112 and the N-type doped region 110 may not be disposed corresponding to each other. A dopant in the P-type doped region 112 is, for example, boron or indium. A doping concentration of the dopant ranges from $5\times10^{13}$ atom/cm$^3$ to $7\times10^{13}$ atom/cm$^3$, for example.

It should be noted that when the substrate 100 is a P-type substrate doped with a P-type dopant, the doping concentration of the P-type doped region 112 has to be higher than a doping concentration of the P-type substrate. The doping concentration of the P-type substrate ranges, for instance, from $7\times10^{11}$ atom/cm$^3$ to $9\times10^{11}$ atom/cm$^3$.

When the electrostatic current is generated and flows to the ESD protection device 10, the electrostatic current flows to the N-type drain region 108 through a drain contact (not shown). Afterwards, since the P-type doped region 112 is disposed under the N-type drain region 108, the electrostatic current flowing to the N-type drain region 108 flows down to the P-type doped region 112. As a result, the circuit path of the electrostatic current is changed. The devices on the surface of the substrate 100 are therefore prevented from being damaged by the electrostatic current.

Figure 2:
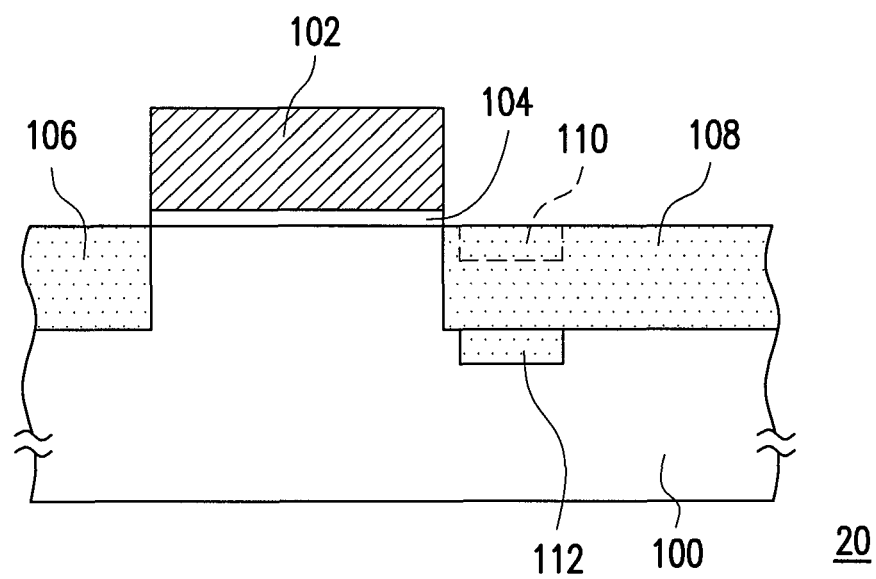
FIG. 2 shows a schematic cross-sectional view of an ESD protection device according to another embodiment of the invention.

FIG. 2 shows a schematic cross-sectional view of an ESD protection device according to another embodiment of the invention. Referring to FIG. 2, an ESD protection device 20 and the ESD protection device 10 are different in that the N-type doped region 110 and the P-type doped region 112 are disposed close to the gate 102, and the P-type doped region 112 and the N-type doped region 110 are disposed corresponding to each other in the ESD protection device 20. Obviously, in other embodiments, the P-type doped region 112 and the N-type doped region 110 may not be disposed corresponding to each other.

Figure 3:
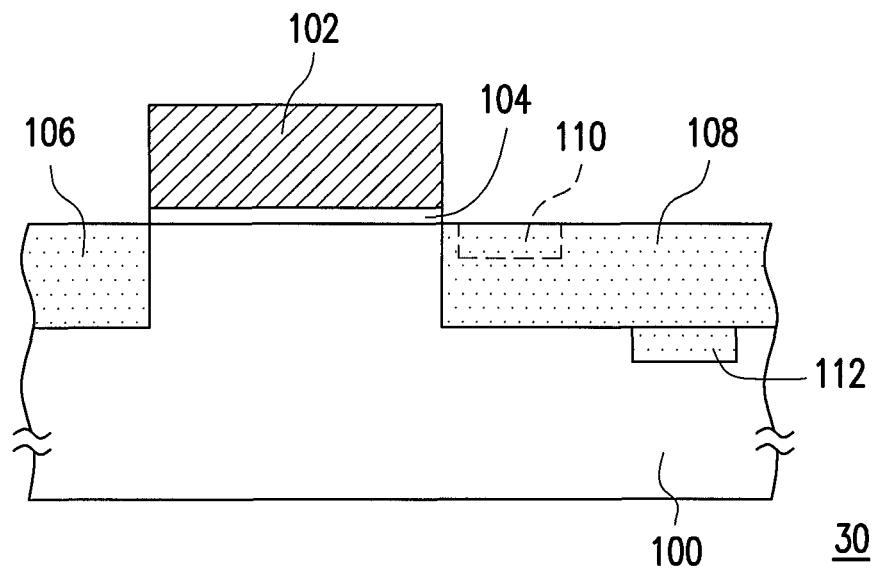
FIG. 3 shows a schematic cross-sectional view of an ESD protection device according to another embodiment of the invention.

FIG. 3 shows a schematic cross-sectional view of an ESD protection device according to another embodiment of the invention. Referring to FIG. 3, an ESD protection device 30 and the ESD protection device 10 are different in that the N-type doped region 110 is disposed close to the gate 102 and the P-type doped region 112 is disposed away from the gate 102 in the ESD protection device 30. Obviously, in other embodiments, the N-type doped region 110 can be disposed away from the gate 102 and the P-type doped region 112 can be disposed close to the gate 102.

It should be illustrated that when the N-type doped region 110 and the top of the N-type drain region 108 are partially connected and the P-type doped region 112 and the bottom of the N-type drain region 108 are partially connected, the dispositions of the N-type doped region 110 and the P-type doped region 112 are not limited to those shown in FIGS. 1 to 3. The N-type doped region 110 and the P-type doped region 112 can be disposed as required by the actual demand.

Figure 4:
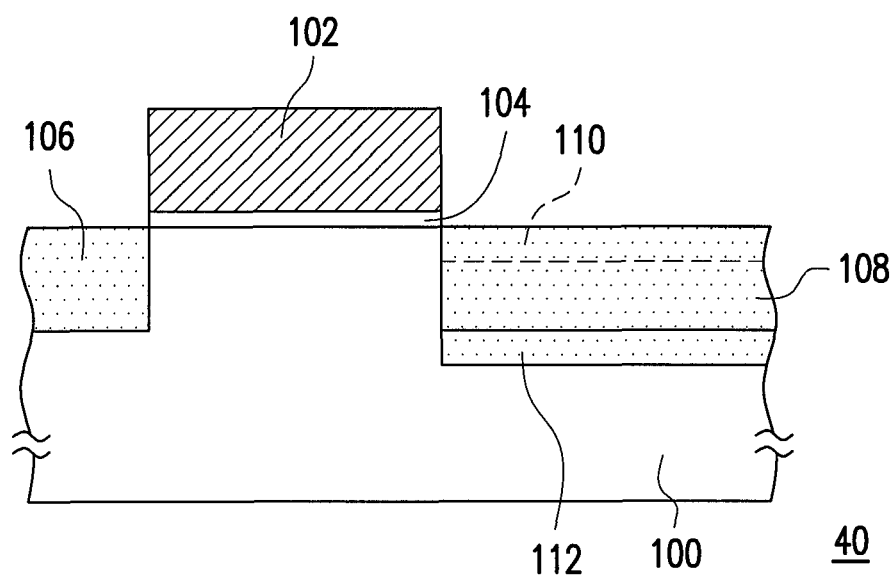
FIG. 4 shows a schematic cross-sectional view of an ESD protection device according to another embodiment of the invention.

FIG. 4 shows a schematic cross-sectional view of an ESD protection device according to another embodiment of the invention. Referring to FIG. 4, an ESD protection device 40 and the ESD protection device 10 are different in that the N-type doped region 110 and the top of the N-type drain region 108 are connected entirely and the P-type doped region 112 and the bottom of the N-type drain region 108 are connected entirely.

The ESD protection device 10 shown in FIG. 1 is used as an example to illustrate a method for manufacturing an ESD protection device in the following. Those skilled in art can also apply the manufacturing method aforementioned in manufacturing ESD protection devices in other embodiments of the invention.

Figure 5A:
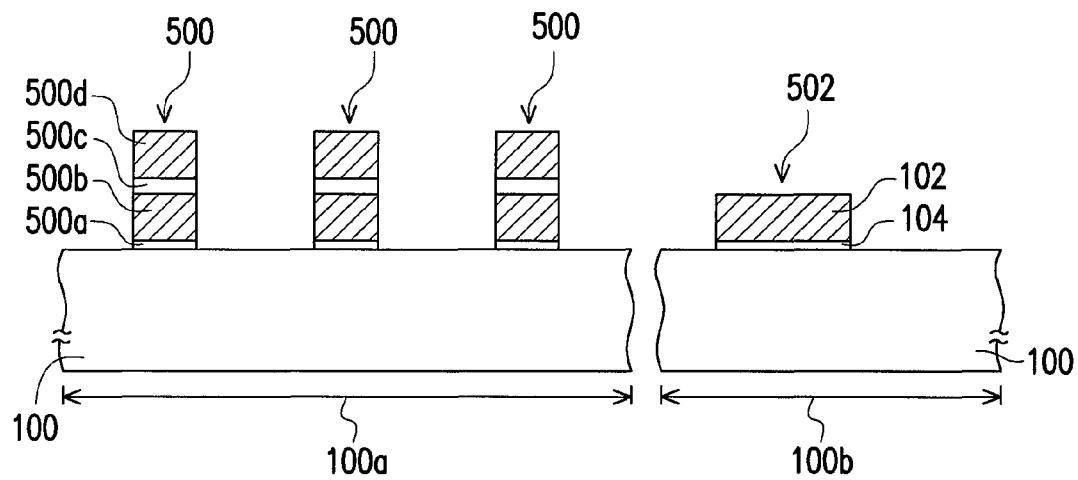
FIGS. 5A to 5C are schematic cross-sectional views illustrating a manufacturing flowchart of an ESD protection device according to an embodiment of the invention.
Figure 5B:
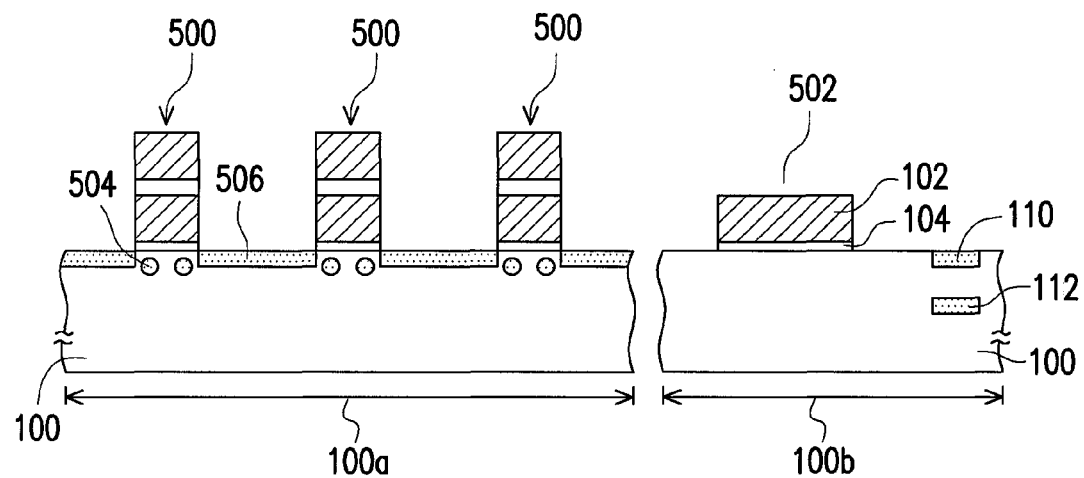
Figure 5C:
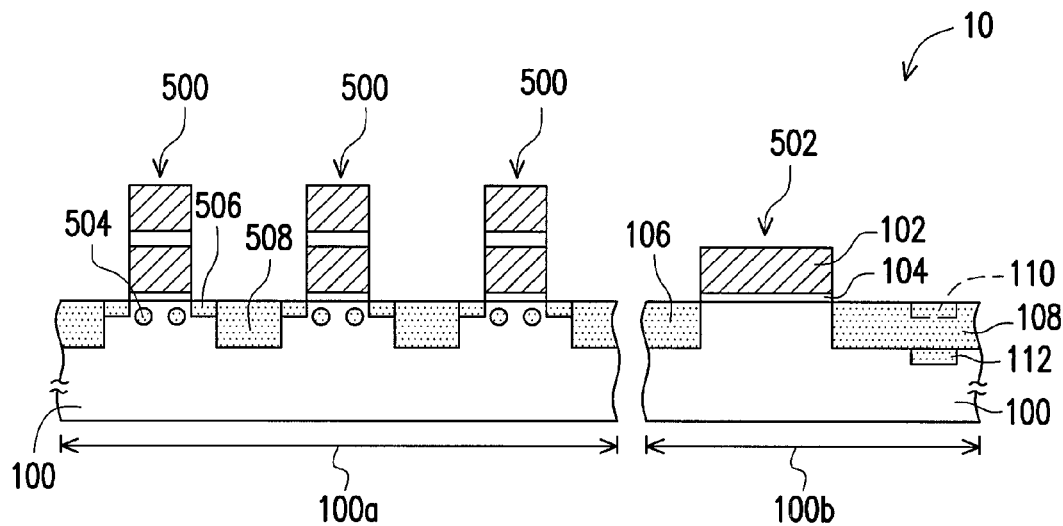

FIGS. 5A to 5C are schematic cross-sectional views illustrating a manufacturing flowchart of an ESD protection device according to an embodiment of the invention. Referring to FIG. 5A, a substrate 100 having a memory region 100a and a peripheral circuit region 100b is provided. The memory region 100a is a region configured to form memory devices and the peripheral circuit region 100b is a region configured to form an ESD protection device of the invention. A first gate structure 500 is formed in the memory region 100a and a second gate structure 502 is formed in the peripheral circuit region 100b.

In the present embodiment, the first gate structure 500 includes a tunneling dielectric layer 500a, a floating gate 500b, an intergate dielectric layer 500c, and a control gate 500d. However, the invention is not limited thereto, the first gate structure 500 can also be other conventional memory gate structures. Also, the second gate structure 502 includes the gate dielectric layer 104 and the gate 102. Those skilled in the art should be familiar with the method for forming the first gate structure 500 and the second gate structure 502 and the details thereof are thus omitted hereinafter.

Referring to FIG. 5B, a first doping process is carried out, such that a P-type pocket doped region 504 is formed in the substrate 100 under the first gate structure 500, an N-type lightly doped drain region 506 is formed in the substrate 100 at two sides of the first gate structure 500, and an N-type doped region 110 and a P-type doped region 112 are formed in the substrate 100 at one of two sides of the second gate structure 502. The P-type pocket doped region 504 is adjacent to the N-type lightly doped drain region 506. The first doping process is, for instance, an ion implantation process. By controlling the depth of ion implantation, the P-type doped region 112 can be located under the N-type doped region 110 and the P-type doped region 112 and the N-type doped region 110 can be separated from each other. A dopant in the P-type pocket doped region 504 and the P-type doped region 112 is, for example, boron or indium. A doping concentration of the dopant ranges from $5\times10^{13}$ atom/cm$^3$ to $7\times10^{13}$ atom/cm$^3$, for example. A dopant in the N-type lightly doped drain region 506 and the N-type doped region 110 is, for example, phosphorus or arsenic. A doping concentration of the dopant ranges from $1\times10^{15}$ atom/cm$^3$ to $2\times10^{15}$ atom/cm$^3$, for example.

Thereafter, referring to FIG. 5C, a second doping process is performed, such that a N-type source/drain region 508 is formed in the substrate 100 at the two sides of the first gate structure 500 respectively and the N-type source region 106 and the N-type drain region 108 are formed in the substrate 100 at the two sides of the second gate structure 502 respectively to form the ESD protection device 10. The second doping process is, for instance, an ion implantation process. By controlling the depth of ion implantation, the N-type doped region 110 can be located in the N-type drain region 108 and can partially connect to the top of the N-type drain region 108, and the P-type doped region 112 can be located under the N-type drain region 108 and can partially connect to the bottom of the N-type drain region 108. A dopant in the N-type source/drain region 508, the N-type source region 106, and the N-type drain region 108 is, for example, phosphorus or arsenic. A doping concentration of the dopant ranges from $3\times10^{15}$ atom/cm$^3$ to $6\times10^{15}$ atom/cm$^3$, for example.

In the manufacturing process of the ESD protection device 10 aforementioned, the N-type doped region 110 and the P-type doped region 112 in the peripheral circuit region 100b and the P-type pocket doped region 504 and the N-type lightly doped drain region 506 in the memory region 110a are formed in the same doping process. In other words, additional steps are not required to form the N-type doped region 110 and the P-type doped region 112 configured to change the current path of the electrostatic current in the invention. As a consequence, the complexity for manufacturing the ESD protection device is reduced and the manufacturing cost of the ESD protection device is decreased.

Figure 6:
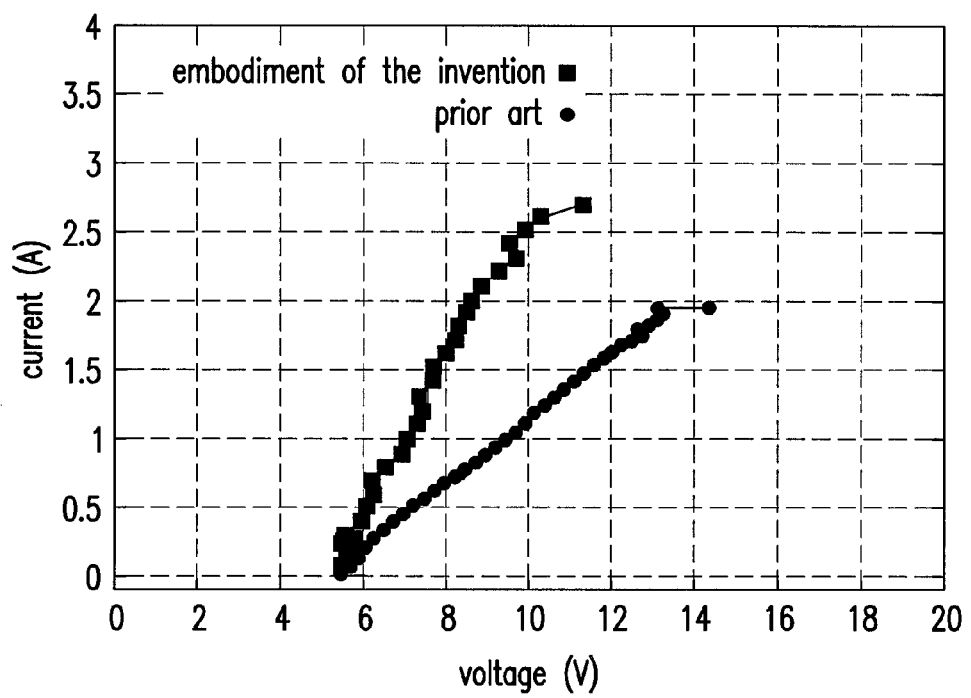
FIG. 6 is a graph showing a relationship between the voltage and the current in the ESD protection device.

FIG. 6 is a graph showing a relationship between the voltage and the current in the ESD protection device. Referring to FIG. 6, when the ESD protection device in the prior art is compared with the ESD protection device in an embodiment of the invention (in which an N-type doped region is disposed in the N-type drain region and a P-type doped region disposed under the N-type drain region), the ESD protection device in an embodiment of the invention can have lower turn-on resistance, so that a higher current can be suffered in the ESD protection device in an embodiment of the invention in the case of applying the same voltage. Hence, the ESD protection device in an embodiment of the invention can have better ESD protection performance.

Furthermore, after forming the ESD protection device, contacts electrically connecting to the N-type source region and the N-type drain region may be formed. The ESD protection device 10 is used as an example to illustrate in the following.

Figure 7:
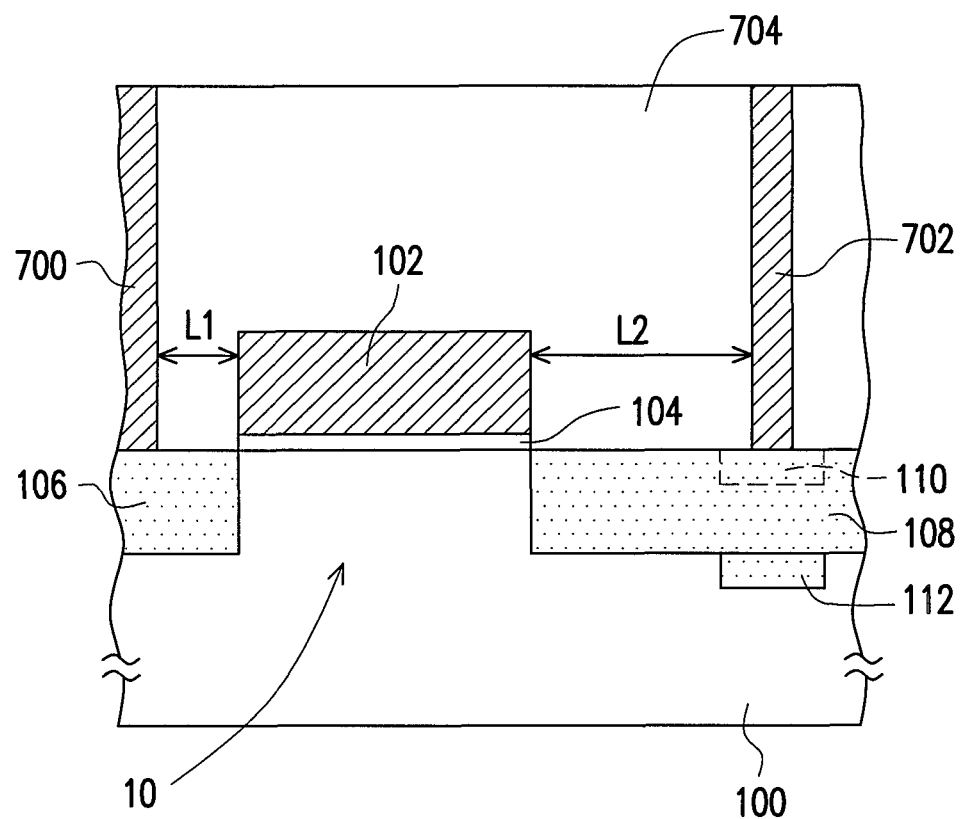
FIG. 7 shows a schematic cross-sectional view of the formation of the contacts after forming the ESD protection device.

FIG. 7 shows a schematic cross-sectional view of the formation of the contacts after forming the ESD protection device. Referring to FIG. 7, a dielectric layer 704 is formed to cover the ESD protection device 10 and contacts 700 and 702 are formed in the dielectric layer 704, wherein the contact 700 is electrically connected to the N-type source region 106 and the contact 702 is electrically connected to the N-type drain region 108. A distance L1 is between the contact 700 and the second gate structure 502. A distance L2 is between the contact 702 and the second gate structure 502. The distance L2 is more than or equal to the distance L1. The distance L1 is in a range of 0.5 µm to 1 µm, for example. The distance L2 is in a range of 1 µm to 3 µm, for example. The distance L2 is preferably 2 µm, such that the ESD protection device 10 can have better second breakdown failure current It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. An electrostatic discharge protection device, comprising:
   a gate dielectric layer disposed on a substrate;
   a gate disposed on the gate dielectric layer;
   an N-type source region and an N-type drain region disposed in the substrate at two sides of the gate respectively;
   an N-type doped region only disposed in the N-type drain region and connecting to a top of the N-type drain region, wherein the top surfaces of the N-type doped region and the N-type drain region are coplanar, and no N-type doped region is disposed in the N-type source region; and
   a P-type doped region only disposed under the N-type drain region and connecting to a bottom of the N-type drain region, wherein no P-type doped region is disposed under the N-type source region.

2. The electrostatic discharge protection device as claimed in claim 1, wherein the P-type doped region connects to the bottom of the N-type drain region partially.

3. The electrostatic discharge protection device as claimed in claim 1, wherein the P-type doped region connects to the bottom of the N-type drain region entirely.

4. The electrostatic discharge protection device as claimed in claim 1, wherein the N-type doped region connects to the top of the N-type drain region partially.

5. The electrostatic discharge protection device as claimed in claim 1, wherein the N-type doped region connects to the top of the N-type drain region entirely.

6. The electrostatic discharge protection device as claimed in claim 1, wherein a doping concentration of the N-type drain region is higher than a doping concentration of the N-type doped region.

7. The electrostatic discharge protection device as claimed in claim 1, wherein the substrate is a P-type substrate and a doping concentration of the P-type doped region is higher than a doping concentration of the substrate.

8. A semiconductor device, comprising:
   a substrate having a memory region and a peripheral circuit region;
   a memory disposed in the memory region; and
   an electrostatic discharge protection device disposed in the peripheral circuit region, the electrostatic discharge protection device comprising:
   a gate dielectric layer disposed on a substrate;
   a gate disposed on the gate dielectric layer;
   an N-type source region and an N-type drain region disposed in the substrate at two sides of the gate respectively;
   an N-type doped region only disposed in the N-type drain region and connecting to a top of the N-type drain region, wherein the top surfaces of the N-type doped region and the N-type drain region are coplanar, and no N-type doped region is disposed in the N-type source region; and
   a P-type doped region only disposed under the N-type drain region and connecting to a bottom of the N-type drain region, wherein no P-type doped region is disposed under the N-type source region.

9. The semiconductor device as claimed in claim 8, wherein the P-type doped region connects to the bottom of the N-type drain region partially.

10. The semiconductor device as claimed in claim 8, wherein the P-type doped region connects to the bottom of the N-type drain region entirely.

11. The semiconductor device as claimed in claim 8, wherein the N-type doped region connects to the top of the N-type drain region partially.

12. The semiconductor device as claimed in claim 8, wherein the N-type doped region connects to the top of the N-type drain region entirely.

13. The semiconductor device as claimed in claim 8, wherein a doping concentration of the N-type drain region is higher than a doping concentration of the N-type doped region.

14. The semiconductor device as claimed in claim 8, wherein the substrate is a P-type substrate and a doping concentration of the P-type doped region is higher than a doping concentration of the substrate.

* * * * *